(12) United States Patent
Lin et al.

(10) Patent No.: US 7,544,281 B2
(45) Date of Patent: Jun. 9, 2009

(54) UNIFORM CURRENT DISTRIBUTION FOR ECP LOADING OF WAFERS

(75) Inventors: Ming-Wei Lin, Hsinchu (TW); Ming-Hsing Tsai, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 674 days.

(21) Appl. No.: 11/119,183

(22) Filed: Apr. 28, 2005

(65) Prior Publication Data

US 2006/0243596 A1 Nov. 2, 2006

(51) Int. Cl.
*C25D 5/02* (2006.01)

(52) U.S. Cl. .................. 205/96; 205/123; 205/137; 205/157; 205/167

(58) Field of Classification Search ............ 204/297.01, 204/297.02, 297.03, 297.06, 297.07, 297.08, 204/224 R, 224 M, 225; 205/96, 123, 137, 205/157, 167
See application file for complete search history.

(56) References Cited

U.S. PATENT DOCUMENTS

| | | | | |
|---|---|---|---|---|
| 6,080,291 A | * | 6/2000 | Woodruff et al. | 204/297.01 |
| 7,285,195 B2 | * | 10/2007 | Herchen et al. | 204/297.01 |
| 2002/0029962 A1 | * | 3/2002 | Stevens et al. | 204/224 R |
| 2003/0150715 A1 | * | 8/2003 | Yahalom et al. | 204/229.1 |
| 2004/0140203 A1 | * | 7/2004 | Burkhart et al. | 204/297.01 |

* cited by examiner

*Primary Examiner*—Bruce F Bell
(74) *Attorney, Agent, or Firm*—Thomas, Kayden, Horstemeyer & Risley

(57) ABSTRACT

An electrochemical plating apparatus and method for facilitating uniform current distribution across a wafer during loading into an ECP (electrochemical plating) apparatus is disclosed. The apparatus includes a bath container for containing a bath solution, an anode provided in the bath container, a cathode ring for supporting a wafer in the bath container and a current source electrically connected to the anode and the cathode ring. According to the method, a voltage potential is applied to the cathode ring as it is immersed into the solution and prior to immersion of the wafer in the solution, thereby facilitating a substantially uniform plating current across the wafer upon immersion of the wafer.

12 Claims, 7 Drawing Sheets

UNIFORM CURRENT DISTRIBUTION FOR ECP LOADING OF WAFERS

FIELD OF THE INVENTION

The present invention relates to electrochemical plating (ECP) apparatuses and processes used to deposit metal layers on semiconductor wafer substrates in the fabrication of semiconductor integrated circuits. More particularly, the present invention relates to an ECP apparatus and method for facilitating uniform current distribution on a wafer during loading of the wafer in the ECP apparatus.

BACKGROUND OF THE INVENTION

In the fabrication of semiconductor integrated circuits, metal conductor lines are used to interconnect the multiple components in device circuits on a semiconductor wafer. A general process used in the deposition of metal conductor line patterns on semiconductor wafers includes deposition of a conducting layer on the silicon wafer substrate; formation of a photoresist or other mask such as titanium oxide or silicon oxide, in the form of the desired metal conductor line pattern, using standard lithographic techniques; subjecting the wafer substrate to a dry etching process to remove the conducting layer from the areas not covered by the mask, thereby leaving the metal layer in the form of the masked conductor line pattern; and removing the mask layer typically using reactive plasma and chlorine gas, thereby exposing the top surface of the metal conductor lines. Typically, multiple alternating layers of electrically conductive and insulative materials are sequentially deposited on the wafer substrate, and conductive layers at different levels on the wafer may be electrically connected to each other by etching vias, or openings, in the insulative layers and filling the vias using aluminum, tungsten or other metal to establish electrical connection between the conductive layers.

Electrodeposition or electroplating of metals on wafer substrates has recently been identified as a promising technique for depositing conductive layers on the substrates in the manufacture of integrated circuits and flat panel displays. Such electrodeposition processes have been used to achieve deposition of the copper or other metal layer with a smooth, level or uniform top surface. Consequently, much effort is currently focused on the design of electroplating hardware and chemistry to achieve high-quality films or layers which are uniform across the entire surface of the substrates and which are capable of filling or conforming to very small device features. Copper has been found to be particularly advantageous as an electroplating metal.

Electroplated copper provides several advantages over electroplated aluminum when used in integrated circuit (IC) applications. Copper is less electrically resistive than aluminum and is thus capable of higher frequencies of operation. Furthermore, copper is more resistant to electromigration (EM) than is aluminum. This provides an overall enhancement in the reliability of semiconductor devices because circuits which have higher current densities and/or lower resistance to EM have a tendency to develop voids or open circuits in their metallic interconnects. These voids or open circuits may cause device failure or burn-in.

A typical standard or conventional electroplating system includes a standard electroplating cell having an adjustable current source, a bath container which holds an electrolyte electroplating bath solution (typically acid copper sulfate solution), and a copper anode and a cathode immersed in the electrolyte solution. The cathode includes a semiconductor wafer that is to be electroplated with metal. A contact ring typically mounts the wafer to the cathode. Both the anode and the cathode are connected to the current source typically by means of suitable wiring.

In operation of the electroplating system, the current source applies a selected voltage potential between the anode and the cathode. This potential creates a electrical field around the anode and the cathode, which electrical field affects the distribution of the copper ions in the bath. In a typical copper electroplating application, a voltage potential of about 0.1~20 volts may be applied for about 2 minutes, and a current of about 0.1~20 amps flows between the anode and the cathode and wafer. Consequently, copper is oxidized at the anode as electrons from the copper anode reduce the ionic copper in the copper sulfate solution bath to form a copper electroplate on the wafer, at the interface between the wafer and the copper sulfate bath.

The copper oxidation reaction which takes place at the anode is illustrated by the following reaction equation:

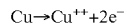
$$Cu \rightarrow Cu^{++} + 2e^-$$

The oxidized copper cation reaction product forms ionic copper sulfate in solution with the sulfate anion in the bath:

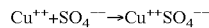
$$Cu^{++} + SO_4^{--} \rightarrow Cu^{++}SO_4^{--}$$

At the wafer, the electrons harvested from the anode flowed through the wiring reduce copper cations in solution in the copper sulfate bath to electroplate the reduced copper onto the wafer:

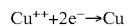
$$Cu^{++} + 2e^- \rightarrow Cu$$

When a copper layer is deposited on the wafer, such as by electrochemical plating, the copper layer must be deposited on a metal seed layer such as copper which is deposited on the wafer prior to the copper ECP process. Seed layers may be applied to the substrate using any of a variety of methods, such as by physical vapor deposition (PVD) and chemical vapor deposition (PVD). Typically, metal seed layers are thin (about 50-1,500 angstroms thick) in comparison to conductive metal layers deposited on a semiconductor wafer substrate.

Conventional electrochemical plating techniques typically use sulfuric acid ($H_2SO_4$) as the electroplating chemical in the electroplating bath solution. The solution may further include additives such as chloride ion and levelers, as well as accelerators and suppressors which increase and decrease, respectively, the rate of the electroplating process. The rate of deposition of copper on the substrate, and the quality and resulting electrical and mechanical properties of the metallization, are largely dependent on the concentration of these organic additives in the electroplating bath solution.

However, one of the drawbacks of using sulfuric acid as the electroplating chemical is that the sulfuric acid has a tendency to damage the copper seed layer and cause poor gap-filling. One method which is used to ameliorate this phenomenon involves applying a bias current to the wafer prior to immersing the wafer in the electroplating bath solution. Upon immersion of the wafer, the circuit between the current source and the cathode and anode is closed, and the electroplating process begins. However, this pre-applied bias activates the electroplating tool alarm if the circuit remains open for too long. Furthermore, a sudden current spike results upon entry of the wafer into the electroplating bath solution, causing local defects and non-uniform plating.

Accordingly, an ECP apparatus and method are needed to facilitate uniform current distribution on a wafer during loading of the wafer in the ECP apparatus.

SUMMARY OF THE INVENTION

The present invention is generally directed to a novel ECP (electrochemical plating) apparatus for facilitating uniform current distribution on a wafer as the wafer is loaded into an ECP solution. The ECP apparatus includes a bath container for containing an electrochemical plating bath solution. The ECP apparatus further includes a cathode ring which supports the wafer and is electrically connected to a current source. The current source is further connected to an anode in the bath container. Before the cathode ring and wafer are loaded into the bath container, the current source applies a voltage potential between the anode and the cathode ring. During loading of the wafer into the solution, the cathode ring is immersed in the solution prior to entry of the wafer into the solution. Consequently, upon subsequent immersion of the wafer in the solution, electrical current having a substantially uniform current density is distributed over the surface of the wafer. This enhances plating uniformity and reduces defects in the electroplated metal.

The present invention is further directed to a novel ECP method of facilitating uniform current distribution on a wafer as the wafer is loaded into an ECP solution. The ECP method includes providing an ECP apparatus having a bath container, an ECP solution in the container, an anode immersed in the ECP solution, a cathode ring, and a current source electrically connected to the anode and cathode ring; supporting the wafer on the cathode ring; applying a voltage potential to the anode and the cathode ring; and immersing the cathode ring in the ECP solution to establish flow of a plating current between the anode and the cathode ring prior to immersing the wafer in the ECP solution.

BRIEF DESCRIPTION OF THE DRAWINGS

The invention will now be described, by way of example, with reference to the accompanying drawings, in which.

DETAILED DESCRIPTION OF THE INVENTION

Figure 1:
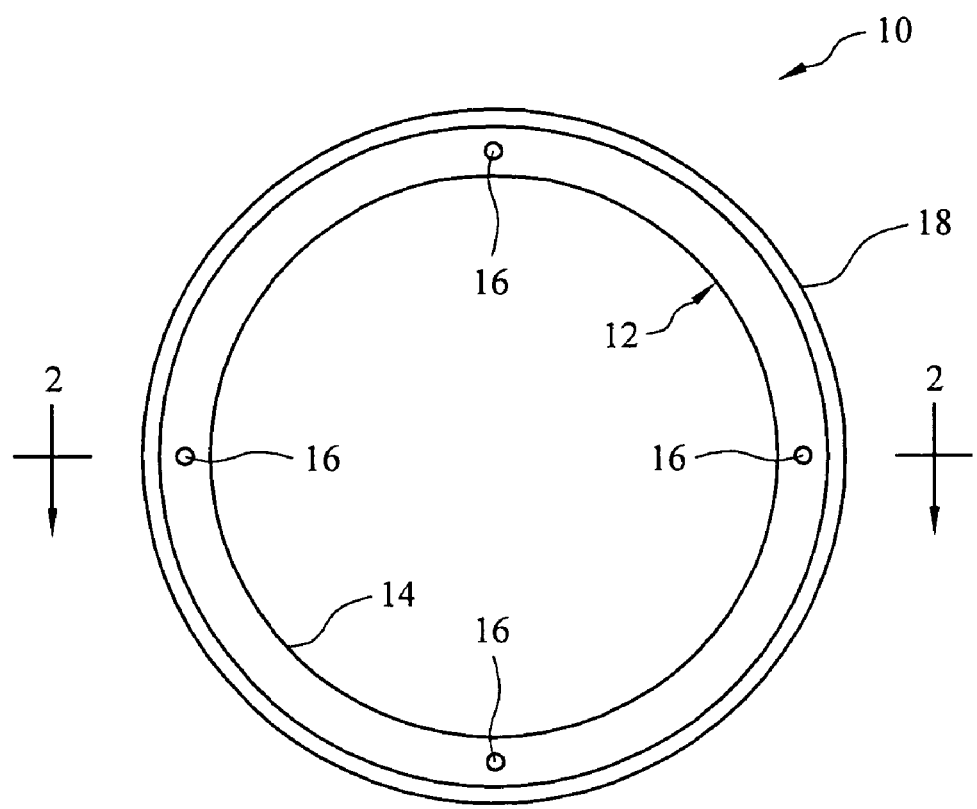
FIG. 1 is a top view of a cathode ring according to one embodiment of the apparatus of the present invention.

The present invention contemplates a novel ECP (electrochemical plating) apparatus which facilitates uniform current distribution on a wafer as the wafer is loaded into an ECP solution. Upon immersion of the wafer in the solution, electrical plating current having a substantially uniform current density is distributed over the surface of the wafer. Consequently, plating uniformity of metal on the wafer is enhanced and defects in the electroplated metal are reduced.

The ECP apparatus includes a bath container which contains an electrochemical plating bath solution, an anode which is provided in the bath container and a cathode ring which supports the wafer. A current source is electrically connected to the anode and the cathode ring. Before the cathode ring and wafer are loaded into the bath container, the current source applies a voltage potential between the anode and the cathode ring. During subsequent loading of the wafer into the solution, the cathode ring is immersed in the solution before the wafer enters the solution, thus establishing a plating current between the anode and the cathode ring. Consequently, upon subsequent immersion of the wafer in the solution, electrical current having a substantially uniform current density is distributed over the surface of the wafer. This enhances plating uniformity and reduces defects in the electroplated metal.

The present invention is further directed to a novel ECP method of facilitating uniform current distribution on a wafer as the wafer is loaded into an ECP solution. According to the method, an ECP apparatus having a bath container, an ECP solution in the container, an anode immersed in the ECP solution, a cathode ring, and a current source electrically connected to the anode and to the cathode ring is provided. The wafer is supported on the cathode ring and the current source applies a plating current to the anode and to the cathode ring. The cathode ring is then immersed in the ECP solution, thus establishing a plating current between the anode and the cathode ring, prior to immersion of the wafer in the ECP solution.

The electroplating apparatus of the present invention may be used with any formulation for the electrolytic fluid, such as copper, aluminum, nickel, chromium, zinc, tin, gold, silver, lead and cadmium electroplating baths. The present invention is also suitable for use with electroplating baths containing mixtures of metals to be plated onto a substrate. It is preferred that the electrolytic fluid be a copper alloy electroplating bath, and more preferably, a copper electroplating bath. Typical copper electroplating bath formulations are well known to those skilled in the art and include, but are not limited to, an electrolyte and one or more sources of copper ions.

Suitable electrolytes include, but are not limited to, sulfuric acid, acetic acid, fluoroboric acid, methane sulfonic acid, ethane sulfonic acid, trifluormethane sulfonic acid, phenyl sulfonic acid, methyl sulfonic acid, p-toluenesulfonic acid, hydrochloric acid, phosphoric acid and the like. The acids are typically present in the bath in a concentration in the range of from about 1 to about 300 g/L. The acids may further include a source of halide ions such as chloride ions. Suitable sources of copper ions include, but are not limited to, copper sulfate, copper chloride, copper acetate, copper nitrate, copper fluoroborate, copper methane sulfonate, copper phenyl sulfonate and copper p-toluene sulfonate. Such copper ion sources are typically present in a concentration in the range of from about 10 to about 300 g/L of electroplating solution.

Other electrochemical plating process conditions suitable for implementation of the present invention include a plating rpm of from typically about 0 rpm to about 500 rpm; a plating current of from typically about 0.2 mA/cm$^2$ to about 80 mA/cm$^2$; a plating voltage of typically about 0.1~20 volts and a bath temperature of from typically about 10 degrees C. to about 35 degrees C. In cases in which planarity of the electroplated metal through chemical mechanical planarization (CMP) is necessary, a leveling agent may be added to the electroplating bath solution at a concentration of from typically about 5 mmol/L to about 5 mol/L.

Figure 2:
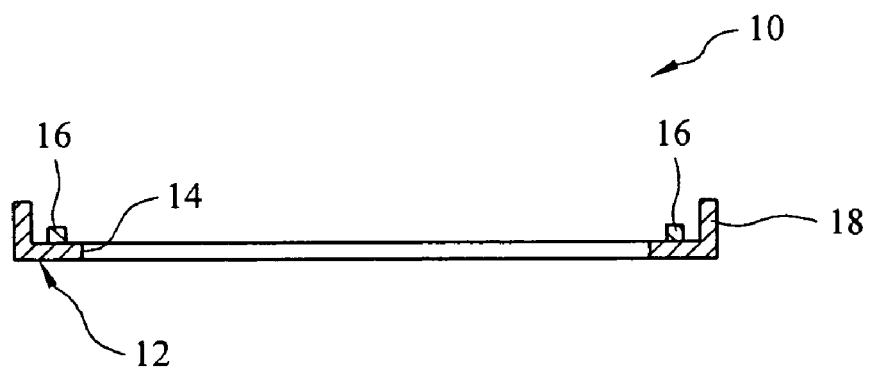
FIG. 2 is a cross-sectional view of the cathode ring, taken along section lines 2-2 in FIG. 1.
Figure 3:
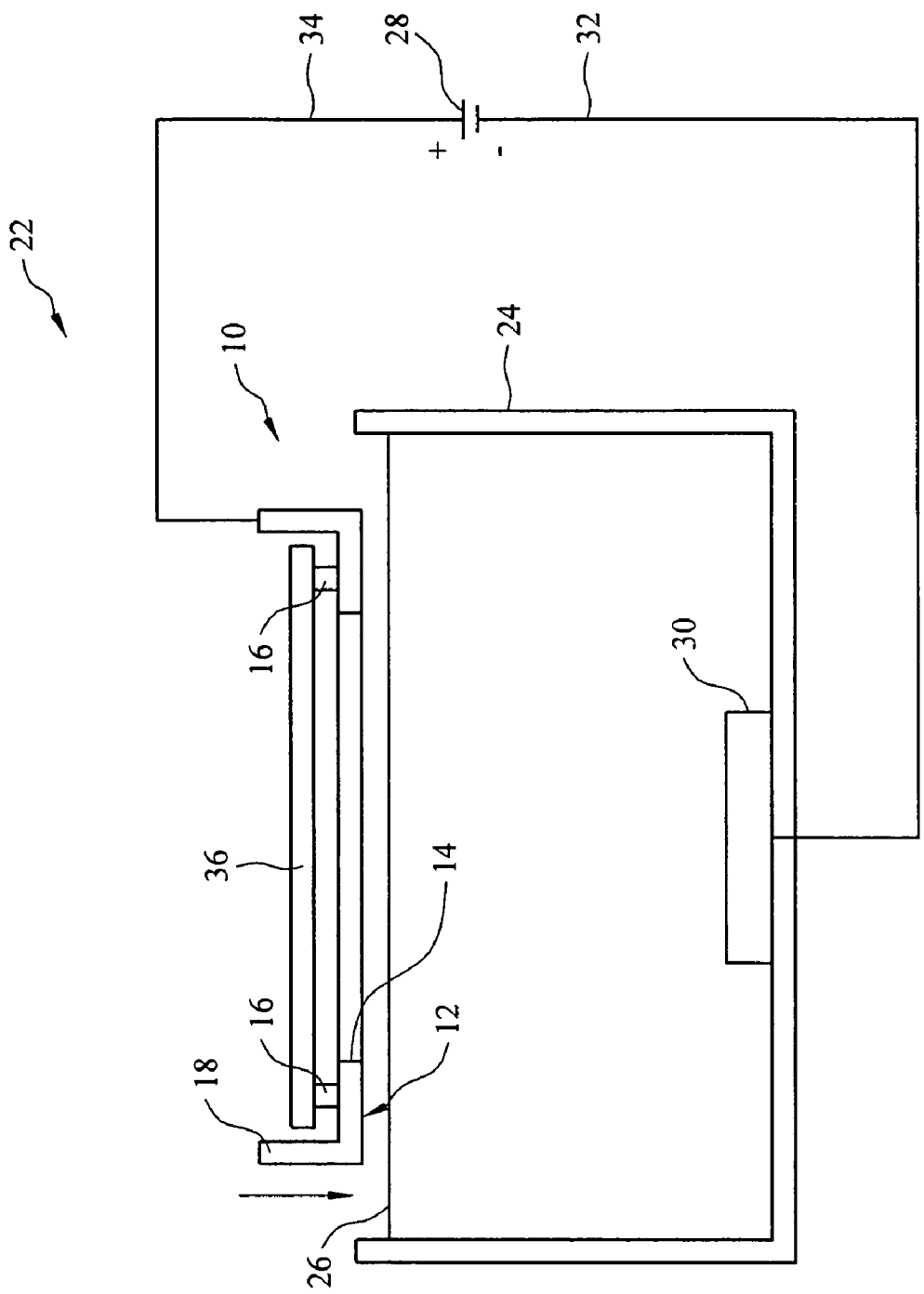
FIG. 3 is a schematic view of an ECP apparatus according to one embodiment of the present invention, which ECP apparatus incorporates the cathode ring of FIGS. 1 and 2, more particularly illustrating application of a voltage potential to the cathode ring prior to immersion of the cathode ring and a wafer supported by the cathode ring into an ECP solution.
Figure 4:
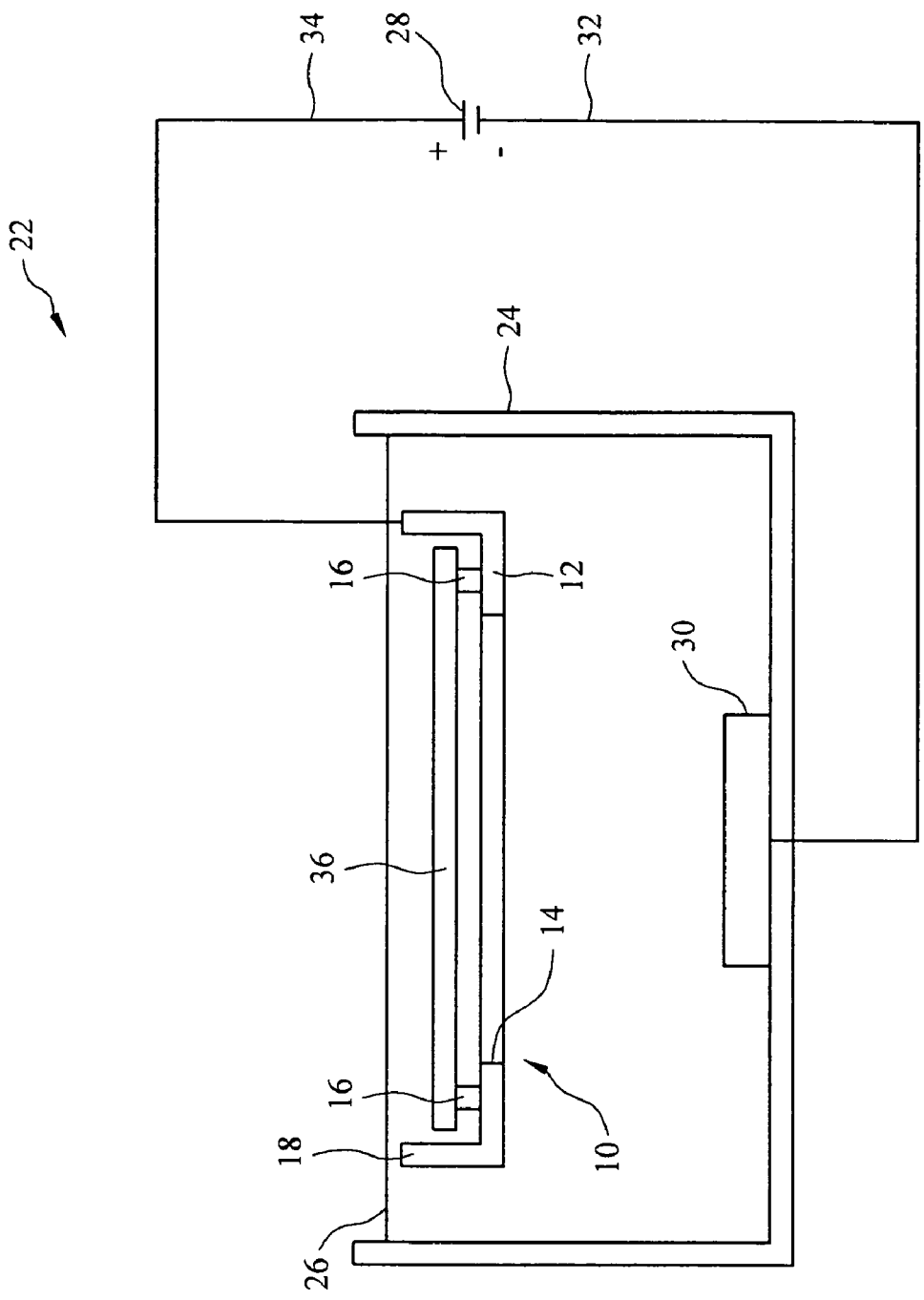
FIG. 4 is a schematic view of the apparatus of FIG. 3, after immersion of the cathode ring and wafer into the ECP solution.

Referring initially to FIGS. 1-4, an illustrative embodiment of an ECP (electrochemical plating) apparatus according to the present invention is generally indicated by reference numeral 22 in FIGS. 3 and 4. The ECP apparatus 22 includes a bath container 24 which is adapted to contain a supply of ECP bath solution 26. An anode 30 is provided in the bath container 24 and is immersed in the ECP bath solution 26 during use of the ECP apparatus 22, as will be hereinafter further described. The ECP apparatus 22 further includes a cathode ring 10, the structural details of which will be hereinafter described. The cathode ring 10 is adapted to support a wafer 36 as the wafer 36 is loaded into the ECP bath solution 26. A current source 28 is electrically connected to the anode 30 through wiring 32 and to the cathode ring 10 through wiring 34 and applies a voltage potential between the anode 30 and the cathode ring 10 to facilitate electrochemical deposition of a metal layer (not shown) on the wafer 36, as will be hereinafter described.

As illustrated in FIGS. 1 and 2, the cathode ring 10 includes an annular ring body 12 having a central ring opening 14. Multiple wafer support pins 16 typically extend upwardly from the ring body 12, in spaced-apart relationship with respect to each other around the ring opening 14. An annular ring flange 18 extends upwardly from the outer edge of the ring body 12. The cathode ring 10 is an electrically-conductive material such as copper (Cu), platinum (Pt), titanium (Ti) or tantalum (Ta), for example.

As illustrated in FIGS. 3 and 4, in typical operation of the ECP apparatus 22, the current source 28 is electrically connected to the anode 30 through the wiring 32 and to the cathode ring 10, typically the ring flange 18 thereof, through the wiring 34. The ECP bath solution 26 is prepared in the bath container 24. The wafer 36 is supported on the upward-standing wafer support pins 16.

Prior to loading of the wafer 36 into the ECP bath solution 26, the current source 28 applies a voltage potential of typically about 0.1~20 volts across the anode 30 and the cathode ring 10. Next, the cathode ring 10 is lowered into the ECP bath solution 26. Accordingly, the cathode ring 10 contacts the ECP bath solution 26 prior to entry of the wafer 36 into the ECP bath solution 26. Therefore, a plating current of from typically about 0.2 mA/cm$^2$ to typically about 80 mA/cm$^2$ is applied by the current source 28 across the anode 30 and cathode ring 10 prior to immersion of the wafer 36 into the ECP bath solution 26. Consequently, upon subsequent immersion of the wafer 36 into the ECP bath solution 26, as shown in FIG. 4, the plating current is distributed substantially uniformly across the surface of the wafer 36. This results in electroplating of a metal layer (not shown) having a substantially uniform thickness and significantly reduced localized defects on the wafer 36 as the metal in the ECP bath solution 26 is oxidized at the anode 30 and reduced at the surface of the wafer 36. After completion of the ECP process, the cathode ring 10 and wafer 36 are lifted from the ECP bath solution 26.

Figure 5:
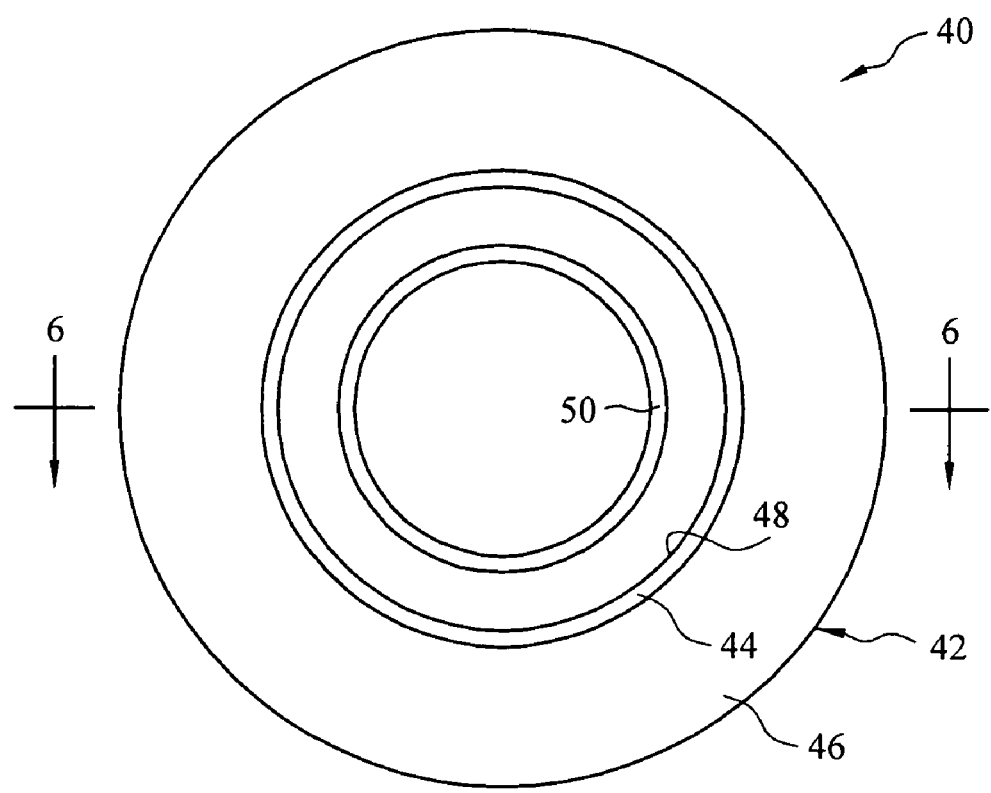
FIG. 5 is a top view of a cathode ring according to another embodiment of the ECP apparatus of the present invention.
Figure 6:
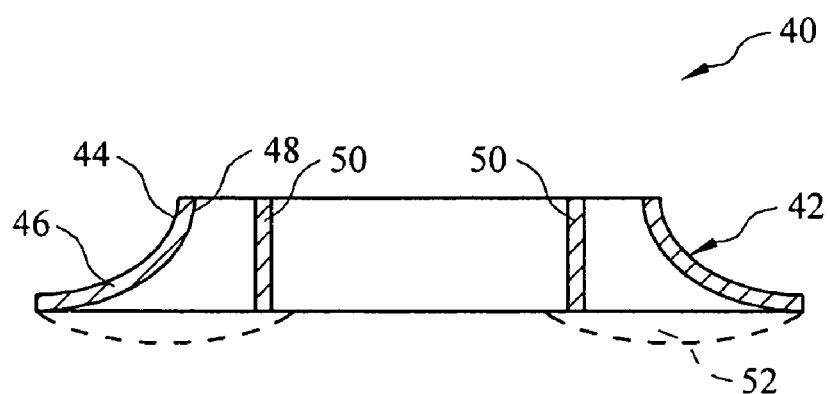
FIG. 6 is a cross-sectional view of the cathode ring, taken along section lines 6-6 in FIG. 5.
Figure 7:
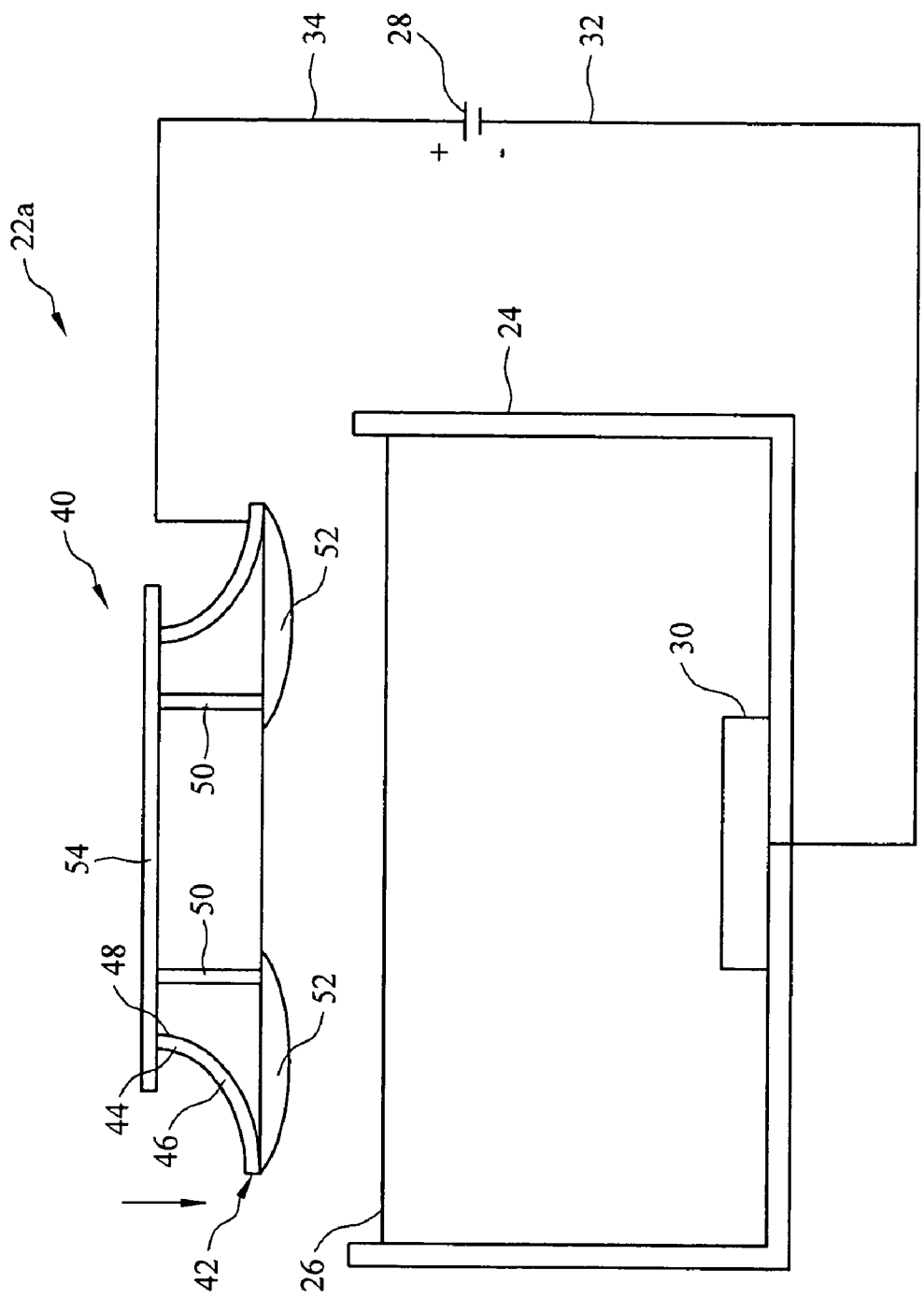
FIG. 7 is a schematic view of an ECP apparatus according to another embodiment of the present invention, which ECP apparatus incorporates the cathode ring of FIGS. 5 and 6, more particularly illustrating application of a voltage potential to the cathode ring prior to immersion of the cathode ring and a wafer supported by the cathode ring into an ECP solution.
Figure 8:
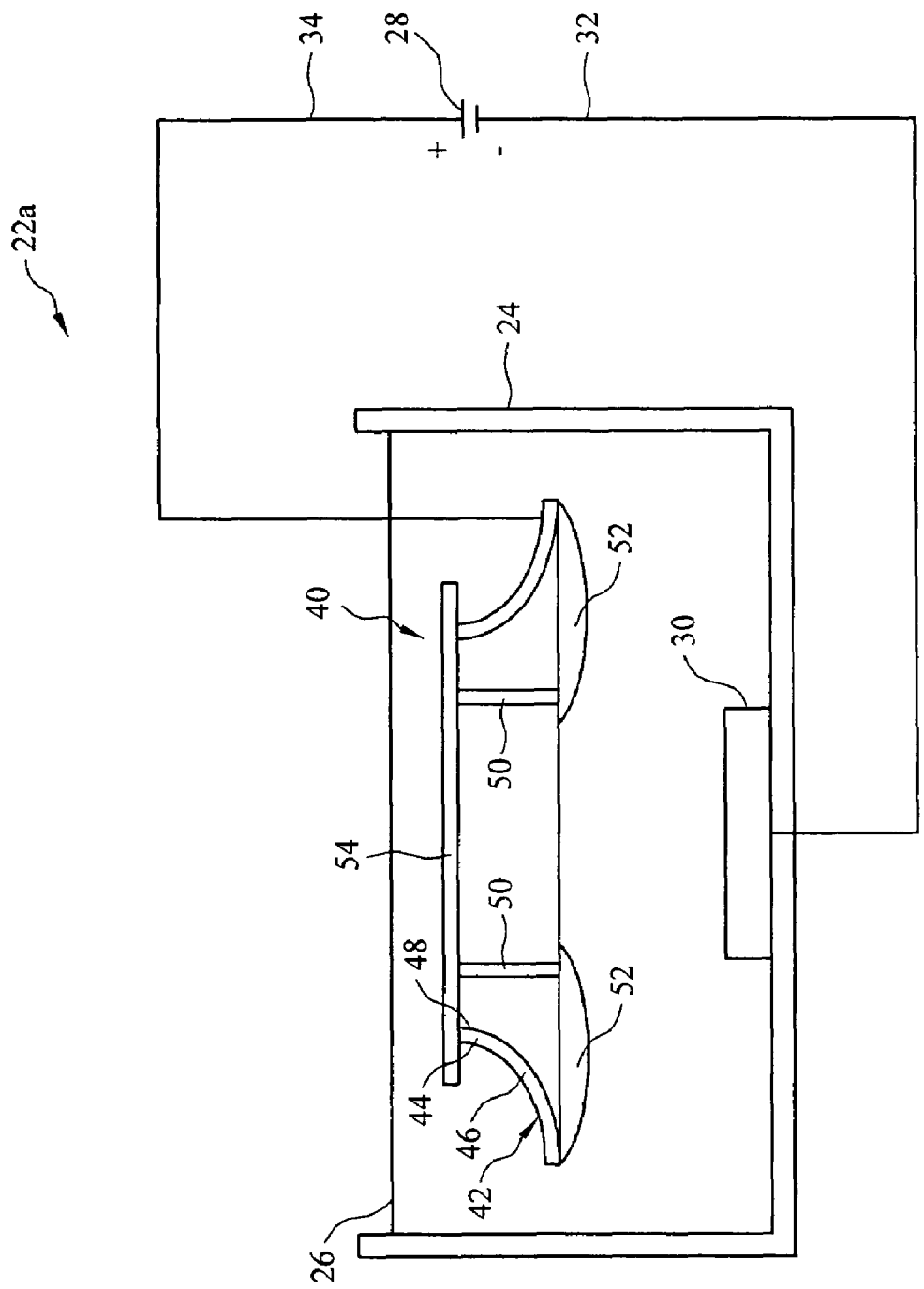
FIG. 8 is a schematic view of the ECP apparatus of FIG. 3, after immersion of the cathode ring and wafer into the ECP solution.

Referring next to FIGS. 5-8, an alternative illustrative embodiment of the ECP apparatus of the present invention is generally indicated by reference numeral 22a. In the ECP apparatus 22a, the current source 28 is electrically connected to the anode 30 and to a cathode ring 40. As shown in FIGS. 5 and 6, the cathode ring 40 is typically a concentric-ring structure and includes an annular ring body 42 having a ring lip 44 which defines a central ring opening 48. An annular ring base 46 extends outwardly from the ring lip 44. The ring body 42 is supported by a loading cup 52. An annular lip seal 50 which is concentric with the ring lip 44 is further supported by the loading cup 52. As shown in FIG. 8, in operation of the ECP apparatus 22a as hereinafter described, as a wafer 54 is supported by the ring lip 44, the lip seal 50 provides a fluid-tight seal between the ECP solution 26 and a portion of the wafer 54.

As illustrated in FIGS. 7 and 8, in operation of the ECP apparatus 22a, the current source 28 is electrically connected to the anode 30 through the wiring 32 and to the cathode ring 40, typically the ring base 46 thereof, through the wiring 34. The ECP bath solution 26 is prepared in the bath container 24. The wafer 54 is supported on the ring lip 44 and lip seal 50 of the cathode ring 40.

Prior to loading of the wafer 54 into the ECP bath solution 26, the current source 28 applies a voltage potential of typically about 0.1~20 volts across the anode 30 and the cathode ring 40. Next, the loading cup 52 lowers the cathode ring 40 into the ECP bath solution 26. The cathode ring 40 contacts the ECP bath solution 26 prior to entry of the wafer 54 into the ECP bath solution 26. Therefore, a plating current of from typically about 0.2 mA/cm$^2$ to typically about 80 mA/cm$^2$ is applied by the current source 28 across the anode 30 and cathode ring 40 prior to immersion of the wafer 54 into the ECP bath solution 26. Consequently, upon subsequent immersion of the wafer 54 into the ECP bath solution 26, as shown in FIG. 8, the plating current is distributed substantially uniformly across the surface of the wafer 54. This results in electroplating of a metal layer (not shown) having a substantially uniform thickness and significantly reduced localized defects on the wafer 54 as the metal in the ECP bath solution 26 is oxidized at the anode 30 and reduced at the surface of the wafer 54. After completion of the ECP process, the cathode ring 40 and wafer 54 are lifted from the ECP bath solution 26.

Figure 9:
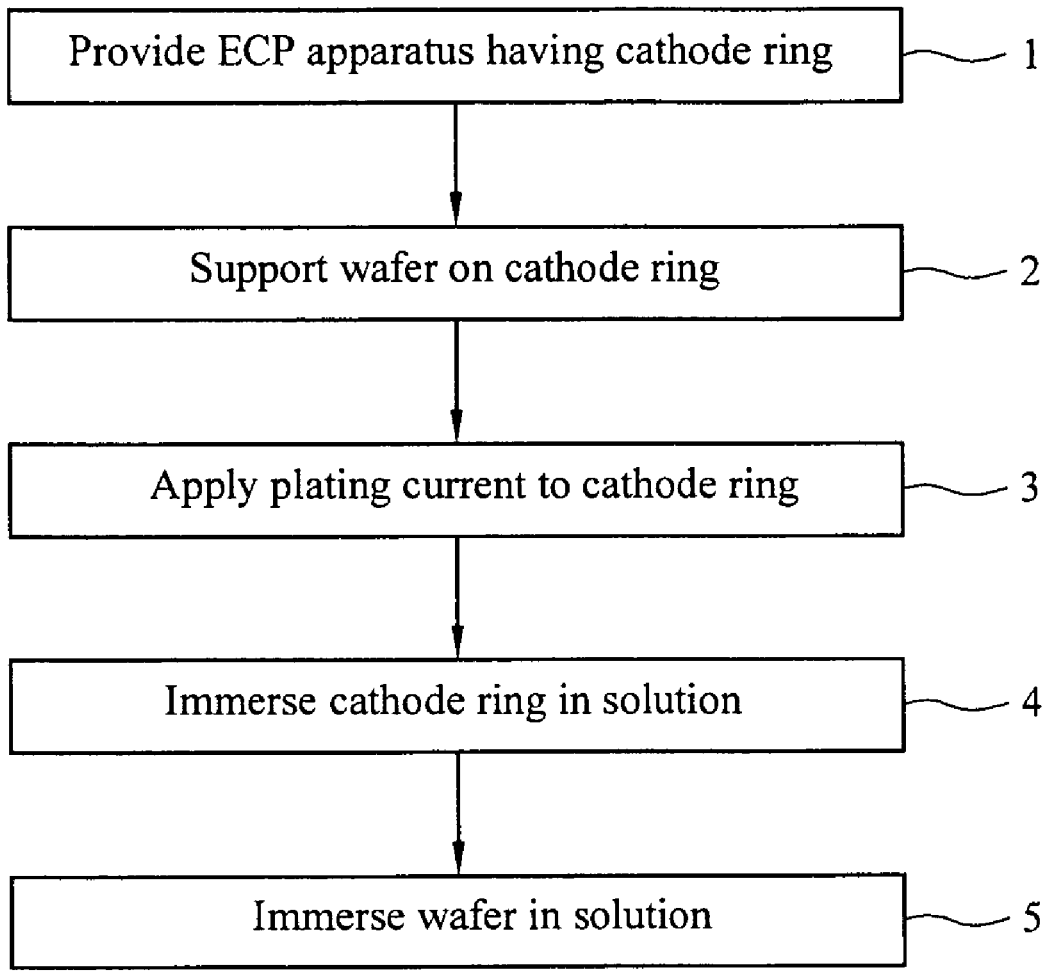
FIG. 9 is a flow diagram illustrating sequential steps carried out according to an ECP method of the present invention.

A flow diagram which summarizes sequential steps carried out according to an ECP method of the present invention is shown in FIG. 9. In step 1, an ECP apparatus having a bath container, an ECP solution in the container, an anode immersed in the ECP solution, a cathode ring, and a current source electrically connected to the anode and cathode ring is provided. In step 2, the wafer is supported on the cathode ring. In step 3, a plating current is applied to the anode and the cathode ring. In step 4, the cathode ring is immersed in the ECP solution. In step 5, continued lowering of the cathode ring in the ECP solution results in immersion of the wafer in the ECP solution.

While the preferred embodiments of the invention have been described above, it will be recognized and understood that various modifications can be made in the invention and the appended claims are intended to cover all such modifications which may fall within the spirit and scope of the invention.

What is claimed is:

1. A method of distributing a uniform plating current over a wafer, comprising:
   providing an electrochemical plating apparatus having a
      bath container, an electrochemical plating solution in said bath container, an anode immersed in said solution, a cathode ring, and a current source electrically connected to said anode and said cathode ring;

supporting a wafer on said cathode ring;

applying a voltage potential to said anode and said cathode ring;

immersing said cathode ring in said solution prior to entry of said wafer into said solution; and applying a plating current to said wafer by immersing said wafer in said solution.

2. The method of claim 1 wherein said cathode ring comprises an annular ring body having a ring opening and a ring flange extending from said ring body.

3. The method of claim 2 further comprising a plurality of wafer support pins extending from said ring body and wherein said supporting a wafer on said cathode ring comprises supporting said wafer on said wafer support pins.

4. The method of claim 3 wherein said current source is electrically connected to said ring flange.

5. The method of claim 1 wherein said voltage potential is about 0.1~20 volts.

6. The method of claim 1 wherein said plating current is from about 0.2 mA/cm$^2$ to about 80 mA/cm$^2$.

7. A method of distributing a uniform plating current over a wafer, comprising:

providing an electrochemical plating apparatus having a bath container, an electrochemical plating solution in said bath container, an anode immersed in said solution, a cathode ring, and a current source electrically connected to said anode and said cathode ring;

providing a loading cup and supporting said cathode ring on said loading cup;

supporting a wafer on said cathode ring;

applying a voltage potential to said anode and said cathode ring;

immersing said cathode ring in said solution by lowering said loading cup into said bath container prior to entry of said wafer into said solution; and applying a plating current to said wafer by immersing said wafer in said solution.

8. The method of claim 7 wherein said cathode ring comprises an annular ring body having a ring opening and an annular lip seal provided in said ring opening in concentric relationship to said ring body.

9. The method of claim 8 wherein said ring body comprises a ring lip and a ring base extending outwardly from said ring lip.

10. The method of claim 8 wherein said current source is electrically connected to said ring body.

11. The method of claim 7 wherein said voltage potential is about 0.1~20 volts.

12. The method of claim 7 wherein said plating current is from about 0.2 mA/cm$^2$ to about 80 mA/cm$^2$.

* * * * *